(12) United States Patent
Hung

(10) Patent No.: US 7,994,477 B2
(45) Date of Patent: Aug. 9, 2011

(54) INFRARED DETECTOR WITH CARBON NANOTUBE YARNS

(75) Inventor: Hsin-Chin Hung, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 304 days.

(21) Appl. No.: 12/472,303

(22) Filed: May 26, 2009

(65) Prior Publication Data

US 2010/0044569 A1   Feb. 25, 2010

(30) Foreign Application Priority Data

Aug. 19, 2008 (CN) .......................... 2008 1 0304045

(51) Int. Cl.
*G01J 5/00* (2006.01)
(52) U.S. Cl. .................................................. 250/338.1
(58) Field of Classification Search ............... 250/338.1, 250/338.4
See application file for complete search history.

(56) References Cited

U.S. PATENT DOCUMENTS

2009/0267060 A1* 10/2009 Forrest et al. ................. 257/40

* cited by examiner

*Primary Examiner* — Mark R Gaworecki
(74) *Attorney, Agent, or Firm* — Raymond J. Chew

(57) ABSTRACT

An infrared detector based on CNT yarns includes a first electrode, a second electrode and a composite film between the first electrode and the second electrode. A first end of the composite film is electrically connected to the first electrode. A second end of the composite film and the second electrode cooperatively define a gap therebetween. The composite film is capable of extending in a direction towards the second electrode and, thereby forming an electrical connection between the first and the second electrodes when the composite film is illuminated by infrared light. The composite film includes a polymer layer, a plurality of semiconducting CNT yarns dispersed in the polymer layer, and a plurality of metallic CNT yarns dispersed in the polymer layer. Each semiconducting CNT yarn includes a plurality of twisted semiconducting CNTs. Each metallic CNT yarn includes a plurality of twisted metallic CNTs.

19 Claims, 2 Drawing Sheets

INFRARED DETECTOR WITH CARBON NANOTUBE YARNS

CROSS-REFERENCE TO RELATED APPLICATION

This application is related to a commonly-assigned copending application, Ser. No. 12/472,297, entitled "ACTUATOR WITH CARBON NANOTUBE YARNS". Disclosures of the above-identified application are incorporated herein by reference.

BACKGROUND

1. Technical Field

The present invention relates to infrared detectors, and particularly to an infrared detector with carbon nanotube (CNT) yarns.

2. Description of Related Art

Infrared radiation is used in a number of applications in the fields of industry, agriculture, medicine, science, communications, and remote sending from space. Infrared detectors have been employed in a variety of fields, such as human body detection, fire detectors, and etc. Typical infrared detectors have complex structures and are expensive.

Therefore, a new infrared detector is desired to overcome the above mentioned problems.

BRIEF DESCRIPTION OF THE DRAWINGS

Many aspects of the embodiment can be better understood with references to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

DETAILED DESCRIPTION

Embodiments will now be described in detail below with reference to the drawings.

Figure 1:
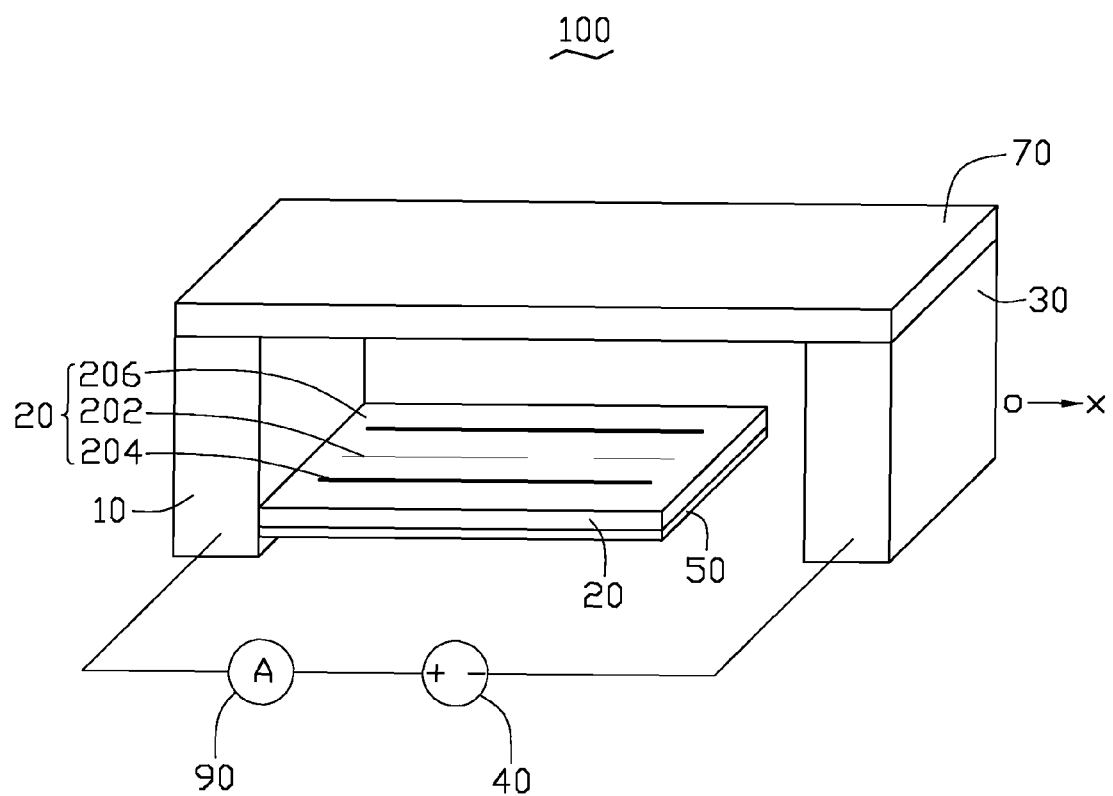
FIG. 1 is a schematic, isometric view of an infrared detector based on CNT yarns according to an exemplary embodiment.
Figure 2:
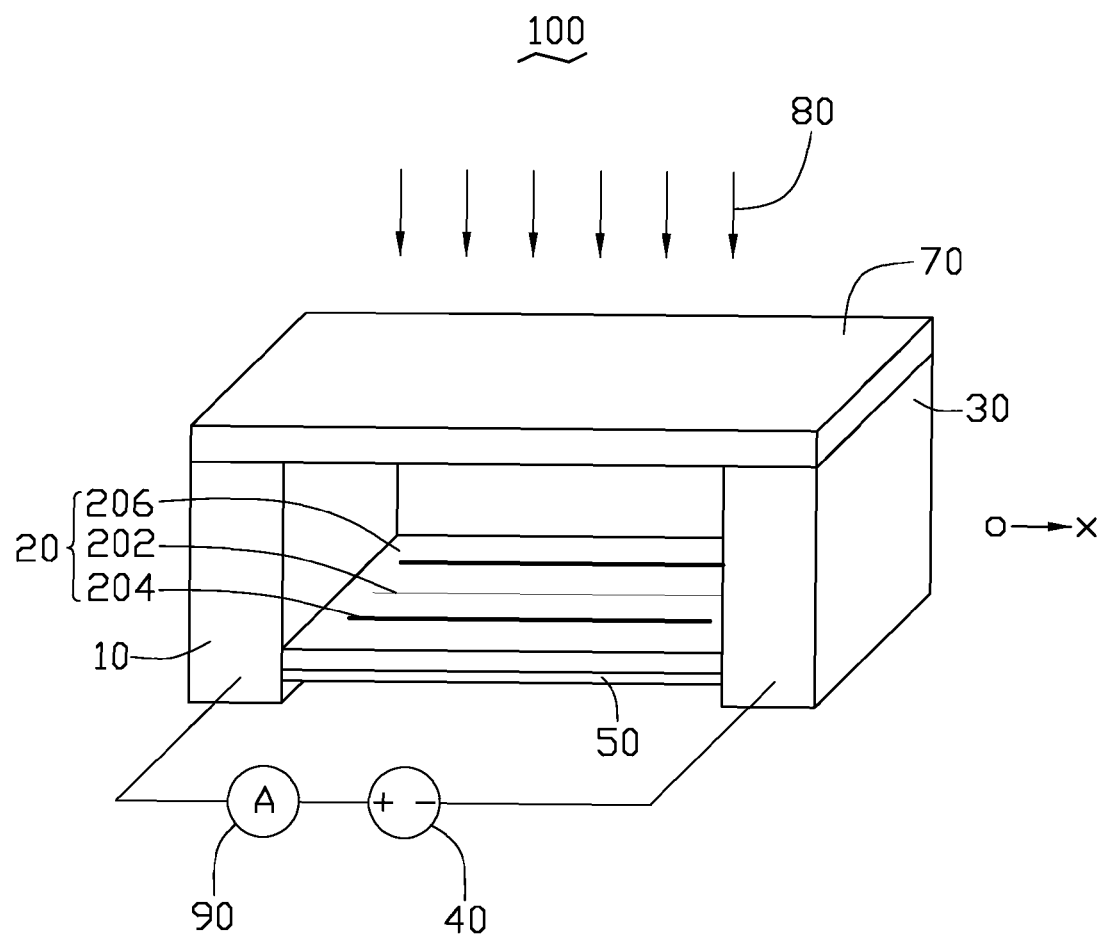
FIG. 2 is a schematic, isometric view of the infrared detector of FIG. 1 when infrared light is incident on the infrared detector.

Referring to FIG. 1, an infrared detector 100 according to an exemplary embodiment is shown. The infrared detector 100 includes a first electrode 10, a second electrode 30 opposite to the first electrode 10, a composite film 20 between the first electrode 10 and the second electrode 20, a reflective film 50, a power supply 40, an ampere meter 90 and an infrared band-pass filter 70.

The power supply 40 includes a positive electrode and a negative electrode connecting with the first electrode 10 and the second electrode 30, respectively. A first end of the composite film 20 is electrically connected with the first electrode 10, and an opposite second end of the composite film 20 and the second electrode 30 cooperatively define a gap. The reflective film 50 is formed on a surface of the composite film 20. The infrared band-pass filter 70 is supported by the first and the second electrodes 10, 30. The infrared band-pass filter 70 is configured for allowing infrared light with a certain wavelength to pass through and then reach the composite film 20.

The composite film 20 is capable of extending in direction OX substantially perpendicular to a surface of the first electrode 10 towards the second electrode 30 when the composite film 20 is illuminated by infrared light (described hereinafter).

The composite film 20 includes a polymer layer 206, a plurality of metallic CNT yarns 202 and a plurality of semiconducting CNT yarns 204 dispersed in the polymer layer 206. The polymer layer 206 is light-pervious. A material of the polymer layer 206 is selected from the group consisting of acrylate rubber, polydimethylsiloxane, and polycarbonates. A longitudinal axis of each CNT yarn 202, 204 is substantially parallel with the direction OX. A length of the CNT yarn 202, 204 along the longitudinal axis is substantially equal to a length of the composite film 20 in the direction OX. The metallic CNT yarn 202 includes a plurality of twisted metallic CNTs (not shown) while the semiconducting CNT yarn 204 includes a plurality of twisted semiconducting CNTs (not shown). Each metallic CNT and semiconducting CNT can be single-walled or multi-walled. The semiconducting CNT yarn 204 and the metallic CNT yarn 202 can be, but not limited to, products of many companies, such as Mknano, which locates in M. K. Impex Canada, 6382 Lisgar Drive, Mississauga, Ontario L5N 6X1, Canada. Also, the semiconducting CNT yarn 204 and the metallic CNT yarn 202 can be fabricated using a method similar to the method as disclosed in U.S. Pat. No. 7,045,108, and U.S. publication 20070166223, which are incorporated herein by reference.

The reflective film 50 is configured for reflecting infrared light 80 passing through the composite film 20 back to the composite film 20. Since the composite film 20 is light-pervious, the reflective film 50 can increase the efficiency of utilizing the infrared light 80.

In operation, when the composite film 20 is irradiated by the infrared light 80 with a particular wavelength, the semiconducting CNTs are excited to generate a plurality of negatively-charged electrons and positively-charged holes. The electrons and the holes move along the metallic CNTs, and, accordingly, a static electric field is formed in the composite film 20. Then, the CNT yarns 121 extend in the direction OX and, therefore, drive the composite film 20 to extend in the direction OX. Accordingly, the composite film 20 elongates and reaches the second electrode 30, thereby forming an electrical connection between the first and the second electrodes 10, 30. Thus, the power supply 40, the ampere meter 90, the first electrode 10, the composite film 20, and the second electrode 30 cooperatively form a closed loop circuit. Accordingly, a current flows through the ampere meter 90, and a value of the current is shown in the ampere meter 90, thereby indicating that the composite film 20 is being irradiated by the infrared light 80 with the particular wavelength.

An amount of elongation of the composite film 20 depends on an intensity of the infrared light 80, an amount of the CNT yarns 202, 204, and a length of each CNT yarn 202, 204. The greater the intensity of the infrared light 80 is, the larger the amount of the CNT yarns 202, 204 is, the larger the length of each CNT yarn 202, 204 is, the larger the amount of elongation of the composite film 20 is. When the infrared light 80 is removed from the composite film 20, the composite film 20 restores to an initial length and is not in contact with the second electrode 30.

It should be noted that the reflective film 50 can be an electrically conductive film. A length of the electrically conductive film in the direction OX is substantially equal to that of the composite film 20 in the direction OX. When the composite film 20 extends along the direction OX, the electrically conductive film elongates in the direction OX together with the composite film 20. When the composite film 20 is in contact with the second electrode 30, the electrically conductive film contacts the second electrode 30 as well so that a better electrical connection is formed between the first and the second electrodes 10, 30.

While certain embodiments have been described and exemplified above, various other embodiments from the foregoing disclosure will be apparent to those skilled in the art. The present invention is not limited to the particular embodiments described and exemplified but is capable of considerable variation and modification without departure from the scope of the appended claims.

What is claimed is:

1. An infrared detector based on carbon nanotube (CNT) yarns comprising:
    a first electrode;
    a second electrode opposite to the first electrode; and
    a composite film between the first electrode and the second electrode, a first end of the composite film being electrically connected to the first electrode, a second end of the composite film and the second electrode cooperatively defining a gap therebetween, the composite film being capable of extending in a direction towards the second electrode and, thereby forming an electrical connection between the first and the second electrodes in response to an infrared light radiation applied onto the composite film, the composite film comprising:
        a polymer layer;
        a plurality of semiconducting CNT yarns dispersed in the polymer layer, each semiconducting CNT yarn comprising a plurality of twisted semiconducting CNTs; and
        a plurality of metallic CNT yarns dispersed in the polymer layer, each metallic CNT yarn comprising a plurality of twisted metallic CNTs.

2. The infrared detector of claim 1, wherein a length of each CNT yarn along the longitudinal axis thereof is substantially equal to a length of the composite film in the direction.

3. The infrared detector of claim 1, wherein each CNT is single-walled or multi-walled.

4. The infrared detector of claim 1, wherein the polymer layer is light-pervious.

5. The infrared detector of claim 1, further comprising a reflective film formed on a surface of the composite film, wherein the reflective film is configured for reflecting the infrared light passing through the composite film back to the composite film.

6. The infrared detector of claim 5, further comprising an infrared band-pass filter, the composite film being positioned between the infrared band-pass filter and the reflective film.

7. The infrared detector of claim 1, further comprising a power supply electrically connected between the first and the second electrodes.

8. The infrared detector of claim 1, further comprising an infrared band-pass filter arranged on one side of the composite film, the infrared band-pass filter being configured for allowing the infrared light with a certain wavelength to pass therethrough and reaching the composite film.

9. The infrared detector of claim 1, wherein a longitudinal axis of each semiconducting CNT yarn is substantially parallel with the direction.

10. The infrared detector of claim 1, wherein a longitudinal axis of each metallic CNT yarn is substantially parallel with the direction.

11. An infrared detector based on CNT yarns comprising:
    a first electrode;
    a second electrode opposite to the first electrode;
    a power supply electrically connected with the first and the second electrode; and
    a composite film between the first electrode and the second electrode, a first end of the composite film being electrically connected to the first electrode, a second end of the composite film and the second electrode cooperatively defining a gap therebetween, the composite film being capable of extending in a direction towards the second electrode and, thereby forming an electrical connection between the first and the second electrodes, thereby achieving a closed loop circuit connecting the first electrode, the composite film, the second electrode and the power supply, if the composite film is illuminated by infrared light, the composite film comprising:
        a polymer layer;
        a plurality of semiconducting CNT yarns dispersed in the polymer layer, each semiconducting CNT yarn comprising a plurality of twisted semiconducting CNTs; and
        a plurality of metallic CNT yarns dispersed in the polymer layer, each metallic CNT yarn comprising a plurality of twisted metallic CNTs.

12. The infrared detector of claim 11, wherein a length of the CNT yarn along the longitudinal axis thereof is substantially equal to a length of the composite film in the direction.

13. The infrared detector of claim 11, wherein each CNT is single-walled or multi-walled.

14. The infrared detector of claim 11, wherein the polymer layer is light-pervious.

15. The infrared detector of claim 11, further comprising a reflective film formed on a surface of the composite film, wherein the reflective film is configured for reflecting the infrared light passing through the composite film back to the composite film.

16. The infrared detector of claim 15, further comprising an infrared band-pass filter, the composite film being positioned between the infrared band-pass filter and the reflective film.

17. The infrared detector of claim 11, further comprising an infrared band-pass filter arranged on one side of the composite film, the infrared band-pass filter being configured for allowing the infrared light with a certain wavelength to pass therethrough and reaching the composite film.

18. The infrared detector of claim 11, wherein a longitudinal axis of each semiconducting CNT yarn is substantially parallel with the direction.

19. The infrared detector of claim 11, wherein a longitudinal axis of each metallic CNT yarn is substantially parallel with the direction.

* * * * *